US008571817B2

(12) United States Patent
Bour et al.

(10) Patent No.: US 8,571,817 B2
(45) Date of Patent: Oct. 29, 2013

(54) INTEGRATED VAPOR DELIVERY SYSTEMS FOR CHEMICAL VAPOR DEPOSITION PRECURSORS

(75) Inventors: David P. Bour, Cupertino, CA (US); Christopher L. Chua, San Jose, CA (US); Zhihong Yang, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 634 days.

(21) Appl. No.: 12/208,255

(22) Filed: Sep. 10, 2008

(65) Prior Publication Data

US 2010/0063753 A1 Mar. 11, 2010

(51) Int. Cl.
*G01F 1/34* (2006.01)

(52) U.S. Cl.
USPC ............... 702/47; 702/45; 702/50; 702/140; 427/255.31; 427/255.36; 427/255.28; 427/248.1; 118/707; 118/715; 118/726

(58) Field of Classification Search
USPC .................. 702/23, 31, 45, 100, 47, 50, 140; 427/255.31, 255.36, 255.07, 96.8, 427/248.1, 255.28; 261/64.4, 20, 128, 22, 261/66, 12.1, 135; 118/707, 715, 726
See application file for complete search history.

(56) References Cited

U.S. PATENT DOCUMENTS

| | | | | |
|---|---|---|---|---|
| 6,561,207 B2 * | 5/2003 | Lowery et al. | ..................... | 137/1 |
| 6,598,462 B2 * | 7/2003 | Williams | ........................ | 73/37.5 |
| 6,613,385 B2 * | 9/2003 | Desito | ...................... | 427/255.31 |
| 6,772,072 B2 * | 8/2004 | Ganguli et al. | .................. | 702/24 |
| 7,011,299 B2 * | 3/2006 | Curran | ............................. | 261/66 |
| 7,295,934 B2 * | 11/2007 | Hairston | .......................... | 702/45 |
| 2003/0021595 A1 * | 1/2003 | Xu et al. | ........................ | 392/400 |
| 2004/0083962 A1 * | 5/2004 | Bang et al. | ..................... | 118/715 |
| 2004/0163590 A1 * | 8/2004 | Tran et al. | ...................... | 118/715 |
| 2004/0247787 A1 * | 12/2004 | Mackie et al. | ............. | 427/248.1 |
| 2006/0162466 A1 * | 7/2006 | Wargo et al. | ............... | 73/861.63 |
| 2007/0192046 A1 * | 8/2007 | Hairston | .......................... | 702/45 |
| 2008/0050510 A1 * | 2/2008 | Stevens et al. | .................... | 427/8 |
| 2008/0215259 A1 * | 9/2008 | Hairston | ......................... | 702/47 |

OTHER PUBLICATIONS

R. Kanjolia, et al. "An accurate continuous level indication for precursor bubblers", J. of Crystal Growth, vol. 261, pp. 236-240, 2004.
J.-Y. Yun, et al. "Real-time quantitative diagnostic technique for measuring chemical vapor deposition precursors". J. of Vacuum Science and Technology, vol. 23, pp. 1267-1269, 2005.
D.P. Bour, et al., "Simple technique for measuring the filled volume of liquid or solid CVD precursor chemicals in bubblers" to be published in J. of Crystal Growth, 2008.
"EpiSensor(TM) level indication system for semiconductor precursors", http://www.sigmaaldrich.com/etc/medialib/docs/Sigma-Aldrich/General_Information/safc-hitech-episensor-levelindicationsystenn.Par.0001.File.tmp/safc-hitech-episensor-levelindicationsystem.pdf.

* cited by examiner

*Primary Examiner* — Carol S Tsai
(74) *Attorney, Agent, or Firm* — Blakely Sokoloff Taylor & Zafman LLP

(57) ABSTRACT

One disclosed feature of the embodiments is a control processor in a vapor delivery system for chemical vapor deposition precursors. A pressurization rate processor calculates first and second pressurization rate curves at first and second time instants. A volume calculator computes consumed volume based on first and second volumes at the respective first and second time instants. The first and second volumes are computed using slopes of lines fitting the first and second pressurization rate curves.

19 Claims, 8 Drawing Sheets

INTEGRATED VAPOR DELIVERY SYSTEMS FOR CHEMICAL VAPOR DEPOSITION PRECURSORS

TECHNICAL FIELD

The presently disclosed embodiments are directed to the field of semiconductor fabrication technology, and more specifically, to chemical vapor deposition.

BACKGROUND

Chemical Vapor Deposition (CVD) methods are commonly used for deposition of electronic and optoelectronic materials and devices. For example, Metal Organic Chemical Vapor Deposition (MOCVD) is an epitaxial deposition technology used to form the compound semiconductor materials and hetero-structures from which laser diodes, light-emitting diodes, transistors, etc. are fabricated. In the MOCVD process, gaseous chemical precursors pass over a heated crystalline substrate seed crystal, where a pyrolytic reaction causes chemical decomposition and subsequently produces solid films. In the prototypical case of GaAs growth, the precursors arsine ($AsH_3$) and trimethylgallium ($[CH_3]_3Ga$) are pyrolyzed to yield the Ga and As species required for growth of the GaAs film. For growth of other compound semiconductors and alloys, analogous mixtures of other group-III organometallic and group-V hydride precursors are blended into the gas stream. Oftentimes the precursor chemicals used in CVD processes are liquids or solids, whose vapors are transported into the deposition chamber by a carrier gas. In the case of MOCVD, group-III metal organic (MO) sources are supplied as liquids or solids, contained in stainless-steel vessels, or bubblers. Among the challenges associated with the use of liquid or solid precursor chemicals in CVD is determining the amount of precursor remaining in the bubbler; and similarly, when the metal organic (MO) source in the bubbler is fully consumed. This is difficult because the source is virtually inaccessible, being contained within an opaque steel container.

Existing techniques to determine the amount of precursor remaining in the bubbler have a number of drawbacks. One technique is to use the deposition reactor's control system to calculate, integrate, and record the amount of transported material (assuming a saturated mixture); and this feature is implemented on many commercial MOCVD reactors. In most cases, it is necessary to remove the bubbler from the system and weigh it to determine the quantity of remaining MO. However, this is undesirable because it involves breaking seals and thus exposes the gas lines to air contamination. Other techniques use fiber optic probes, capacitance-based probing, whereby the steel bubbler itself forms one plate of a capacitor, and a rod inserted into the center of the bubbler comprises the other plate, and the MO liquid is the dielectric between them; and ultrasonic detection where an ultrasonic transducer bounces sound off the liquid surface to determine its exact height. However, these techniques are expensive, requiring complex electronics and parts. In addition, they are not so easily applied to solid precursors, such as the commonly used trimethylindium, biscyclopentadienylmagnesium, and carbonterabromide. Another option is an instrument that directly measures the OM vapor concentration in the carrier gas, based on measuring the speed of sound in the gas mixture. This method offers good control of gas mixture compositions; but for most situations it is not useful for determining the fill level of a bubbler.

SUMMARY

One disclosed feature of the embodiments is an integrated vapor delivery system for chemical vapor deposition precursors. A flow controller controls gas flow through a bubbler to provide a plurality of flow measurements at first and second instants. A pressure controller measures pressure in the bubbler. The pressure controller provides a plurality of pressure measurements corresponding to the plurality of flow measurements at the first and second instants. A control processor determines amount of precursor chemical in the bubbler based on volume consumed between first and second instants using the plurality of flow measurements and the corresponding plurality of pressure measurements.

One disclosed feature of the embodiments is a control processor in a vapor delivery system for chemical vapor deposition precursors. A pressurization rate processor calculates first and second pressurization rate curves at first and second time instants. A volume calculator computes consumed volume based on first and second volumes at the respective first and second time instants. The first and second volumes are computed using slopes of lines fitting the first and second pressurization rate curves.

One disclosed feature of the embodiments is a method an integrated vapor delivery system for chemical vapor deposition precursors. Gas flow is controlled through a bubbler to obtain a plurality of flow measurements at first and second instants. Pressure is measured in the bubbler to obtain a plurality of pressure measurements corresponding to the plurality of flow measurements at the first and second instants. Amount of precursor chemical in the bubbler is determined based on volume consumed between first and second instants using the plurality of flow measurements and the corresponding plurality of pressure measurements.

BRIEF DESCRIPTION OF THE DRAWINGS

Embodiments may best be understood by referring to the following description and accompanying drawings that are used to illustrate embodiments. In the drawings.

DETAILED DESCRIPTION

One disclosed feature of the embodiments is an integrated vapor delivery system for chemical vapor deposition precursors. A flow controller controls gas flow through a bubbler to provide a plurality of flow measurements at first and second instants. A pressure controller measures pressure in the bubbler. The pressure controller provides a plurality of pressure measurements corresponding to the plurality of flow measurements at the first and second instants. A control processor determines amount of precursor chemical in the bubbler based on volume consumed between first and second instants using the plurality of flow measurements and the corresponding plurality of pressure measurements.

One disclosed feature of the embodiments is a control processor in a vapor delivery system for chemical vapor deposition precursors. A pressurization rate processor calculates first and second pressurization rate curves at first and second time instants. A volume calculator computes consumed volume based on first and second volumes at the respective first and second time instants. The first and second volumes are computed using slopes of lines fitting the first and second pressurization rate curves.

In the following description, numerous specific details are set forth. However, it is understood that embodiments may be practiced without these specific details. In other instances, well-known circuits, structures, and techniques have not been shown to avoid obscuring the understanding of this description.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a technique to provide integrated control of flow and pressure for bubblers, or stainless-steel vessels, containing MO sources used in CVD processes. The technique determines volumes or masses of chemical precursors used in the bubblers in an efficient manner. The calculation of a volume of a gas flow in a bubbler is based on the pressurization rates in the bubbler. By integrating the mass flow controller and the back-pressure controller into an integrated controller, the determination of the volume, and thus the mass, of the material may be performed efficiently, providing continuous, real-time, measurements of material consumption in the bubbler.

Figure 1:
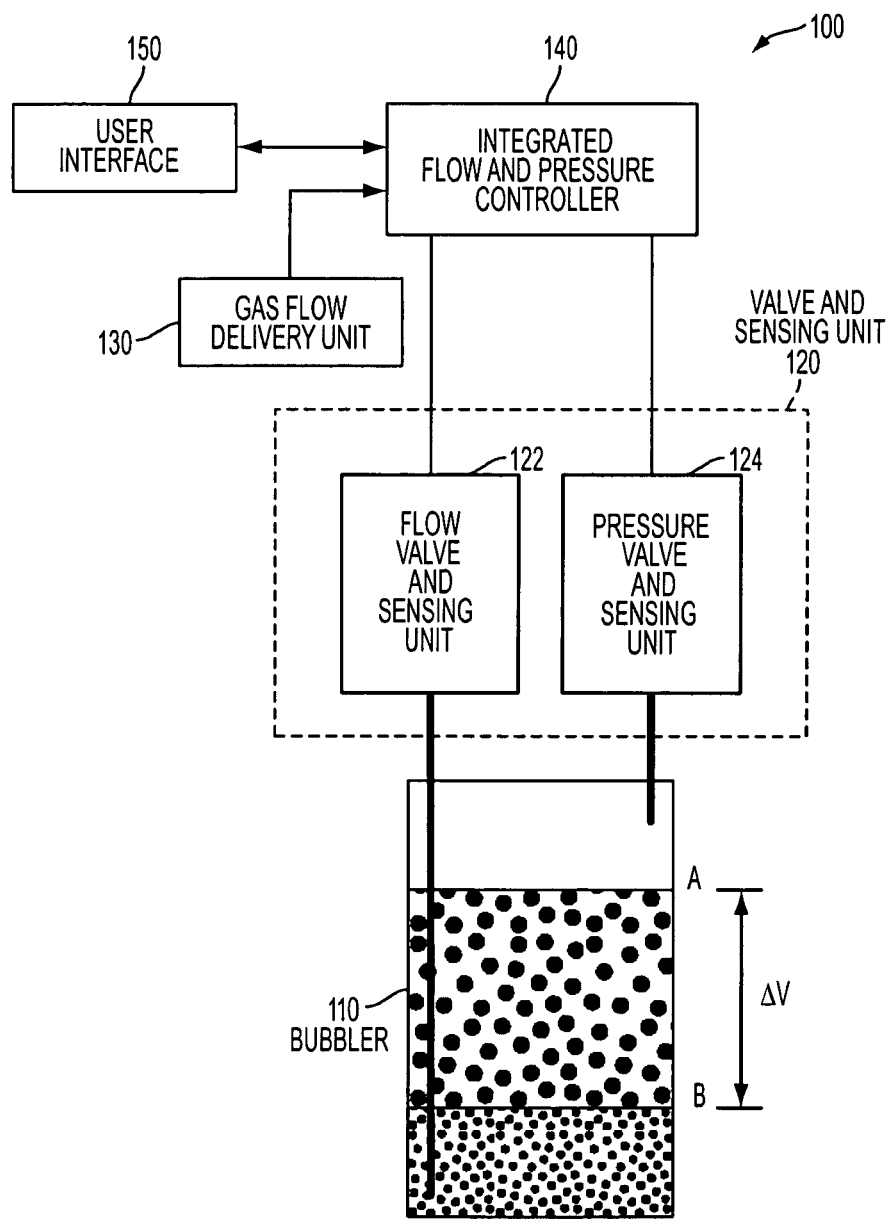
FIG. 1 is a diagram illustrating a system in which one embodiment may be practiced.

FIG. 1 is a diagram illustrating a system 100 in which one embodiment may be practiced. The system 100 includes a bubbler 110, a valve and sensing unit 120, a gas flow delivery unit 130, an integrated flow and pressure controller 140, and a user interface 150. The system 100 may include more or less than the above components.

The bubbler 110 may be any vessel that contains the MO sources such as group-III metal organic liquids or solids. It may be a stainless-steel vessel. The bubbler 110 may be immersed in a constant-temperature bath in order to control the precursor's vapor pressure. Initially or at a first time instant, the liquid/solid level may be at level A. At a second time instant, after the bubble is used for a time period, the liquid/solid level reduces to level B. The volume difference $\Delta V$ is the volume consumed during the time period from the first instant to the second instant.

The valve and sensing unit 120 may includes various valves or actuators to control the flow and pressurization of gas in the bubbler 110. It may also include sensors to provide measurements of flow or pressure in the bubbler 110. For example, it may include manual valves at its inlet and outlet for isolation during connection and removal, pneumatically actuated valves at the inlet and outlet to control of the source during deposition, or a bypass valve which allows the carrier gas to bypass the bubbler 110 rather than flow through it. The valve and sensing unit 120 may include a flow valve and sensing assembly 122 and a pressure valve and sensing assembly 124. The flow valve and sensing assembly 122 provides valves and sensors to regulate the flow into and out of the bubbler 110 and to provide readings of the flow values. The pressure valve and sensing assembly 124 provides valves and sensors to regulate the pressure in the bubbler 110 and to provide readings of the pressure values. It may include a pressure transducer with a downstream needle-valve to control the bubbler's internal pressure.

The gas flow delivery unit 130 deliver the carrier-gas flow typically $H_2$ or $N_2$, through the bubbler 110 via the integrated flow and pressure controller 140.

The integrated flow and pressure controller 140 performed integrated control and monitor of the flow and pressure in the bubbler 110. It provides commands to the various valves or actuators in the valve and sensing unit 120 to open, close, or regulate the flow and pressure valves. It also obtains readings of flow and pressure measurements from the sensors in the valve and sensing unit 120. Since the control functions for the flow and pressure are integrated within a single unit, they can be performed efficiently and accurately. In addition, the pressurization rate measurements may be performed automatically and continuously to provide real-time results.

The user interface 150 provides interface to a user or an operator for various actions including obtaining user's input entries, displaying results, providing operator's menu, etc.

Figure 2:
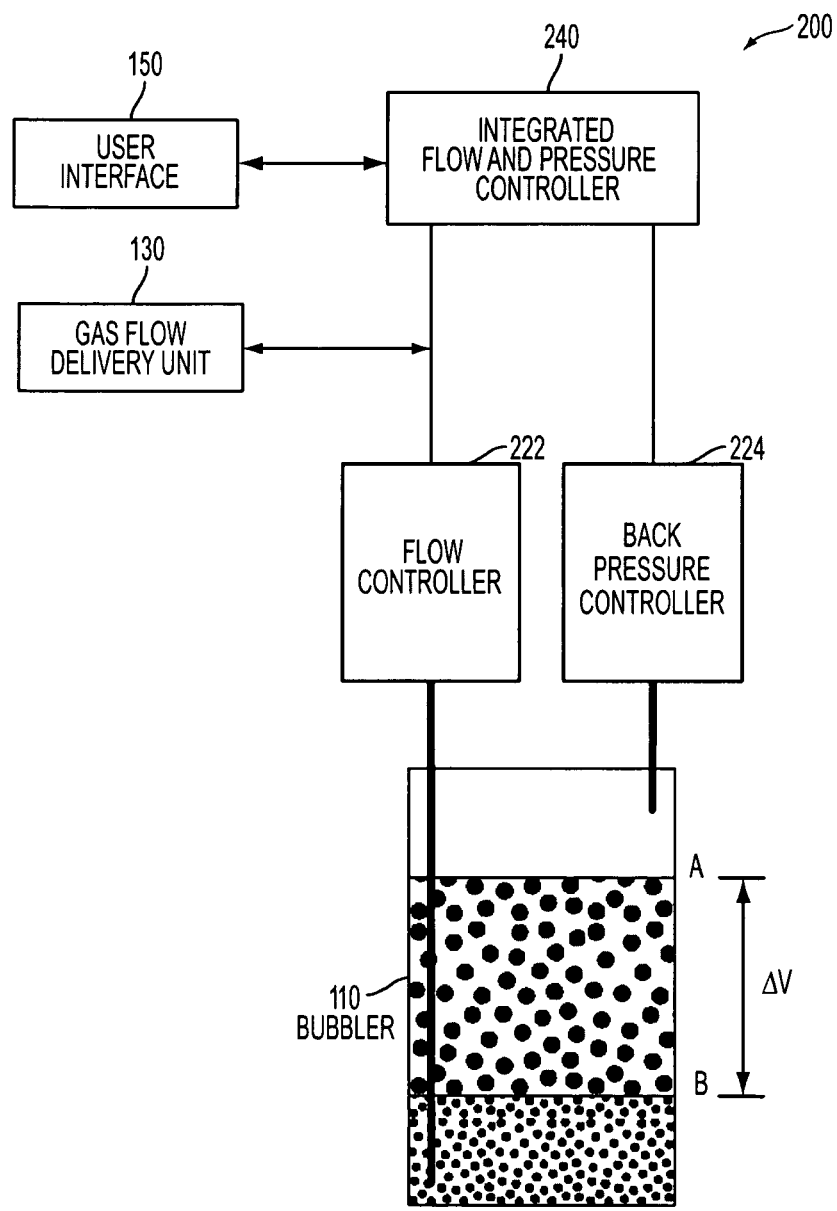
FIG. 2 is a diagram illustrating a system using existing flow and pressure controllers according to one embodiment.

FIG. 2 is a diagram illustrating a system 200 using existing flow and pressure controllers according to one embodiment. The system 200 includes similar components as in the system 100 shown in FIG. 2 except that it includes an integrated flow and pressure controller 240, a flow controller 222 and a back pressure controller 224 instead of the integrated flow and pressure controller 140, the flow valve and sensing unit 122 and the pressure valve and sensing unit 124, respectively.

The flow controller 222 and the back pressure controller 224 are conventional flow controller and back pressure controller used in commercial systems. The integrated flow and pressure controller 240, therefore, mainly includes the electronic components or processors that implements the pressurization rate technique for a rapid evaluation of bubbler fill and/or zero-offset correction as described in the following. The integrated flow and pressure controller 240 may be similar to the integrated flow and pressure controller 140 or it may include only the control processor 340 as shown in FIG. 3 below.

Figure 3:
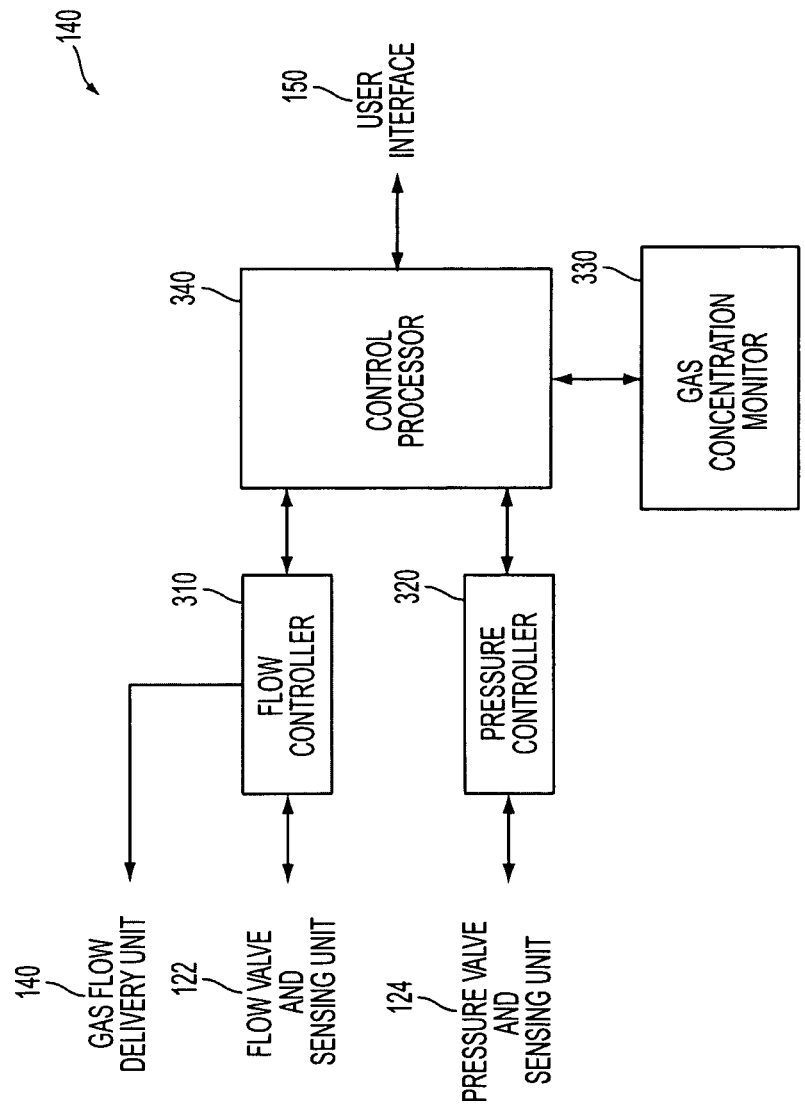
FIG. 3 is a diagram illustrating an integrated flow and pressure controller according to one embodiment.

FIG. 3 is a diagram illustrating the integrated flow and pressure controller 140 shown in FIG. 1 or the integrated flow and pressure controller 240 shown in FIG. 2 according to one embodiment. The integrated flow and pressure controller 140 or 240 includes a flow controller 310, a pressure controller 320, a gas concentration monitor 330, and a control processor 340. The integrated flow and pressure controller 140 or 240 may include more or less than the above components.

The flow controller 310 receives the gas flow from the delivery unit 140 (FIG. 1). It interfaces to the flow valves and sensing unit 122 to perform flow control and measurement functions. It may include electronic or electromechanical components that accept commands or inputs (e.g., set points) from the control processor 340, output control words to, and read from, the flow valves and sensing unit 122. In one embodiment, it controls gas flow through the bubbler 110 and provides a plurality of flow measurements at first and second instants. The first and second time instants are the two times marking a period during which the mass of the material in the bubbler 110 is consumed over the lifetime of the bubbler 110. When the first time instant corresponds to the initial time when the bubbler is newly installed, the initial volume or mass value may be determined to establish the reference value. At the second time instant, the consumed volume or mass may be determined and the remaining mass of the material in the bubbler 110 may be obtained.

The pressure controller 320 interfaces to the pressure valves and sensing unit 124 to perform pressure control and measurement functions. It may include electronic or electromechanical components that accept commands or inputs (e.g., set points) from the control processor 340, output control words to, and read from, the pressure valves and sensing unit 124. In one embodiment, the pressure controller 320 measures pressure in the bubbler 110 and provides a plurality of pressure measurements corresponding to the plurality of flow measurements at the first and second instants.

The gas concentration monitor 330 monitors the gas concentration in the bubbler 110 to adjust the gas flow and pressurization in the bubbler for a given mass flow value.

The control processor 340 is coupled to the flow controller 310 and the pressure controller 320 to determine amount of precursor chemical in the bubbler 110 based on volume consumed between first and second instants using the plurality of flow measurements and the corresponding plurality of pressure measurements as provided by the flow controller 310 and the pressure controller 320, respectively. The control processor 340 communicates with the user interface 150 to receive operator's inputs and generates results or displays data.

The principle underlying the bubbler fill measurement is based on the perfect gas law. The liquid level for a new bubbler is shown at level A in FIG. 1. The flow controller 310 is used to meter a known flow (f) of gas, typically hydrogen or nitrogen, while the pressure controller 320 measures and controls the total pressure (P) in the bubbler 110. If a downstream valve is closed, the bubbler 110 will pressurize. The downstream valve may be the internal needle valve of the pressure controller 320, or a downstream isolation shutoff valve. The rate of pressurization may be monitored with the pressure controller 320 and the control processor 340. This pressurization rate is governed by the perfect-gas law, and it is proportional to the flow, and inversely proportional to the volume of the bubbler 110 plus gas lines being filled. If this pressurization rate is re-measured at the second instant after some of the precursor has been consumed, thereby increasing the unfilled volume of the bubbler 110, the pressurization rate will be slower. By comparing the pressurization rates of a partially consumed precursor bubbler 110, with that of a new bubbler 110 whose content is known and not yet consumed at the first instant, the volume of consumed precursor chemical may be obtained throughout the life of the bubbler 110.

The pressurization rate determines the available gas volume through the perfect gas law. This pressurization rate measurement data are thus fit to the perfect gas law's description of the pressurization rate's dependence on flow, volume and temperature:

$$\frac{dP}{dt} = RT\frac{dn}{dt} \quad (1)$$

where n is number of moles of gas, R the universal gas constant: 62,364 cm³ Torr/mol K, T the absolute temperature, dP/dt is the pressurization rate, and V the volume. The molar rate dn/dt is related to the flow into the volume, set by the flow controller 310 through the standard molar volume constant:

$$\frac{dn}{dt} = RT\frac{\text{flow}}{224 \times 10^3 (std \text{ cm}^3/\text{mol})} \quad (2)$$

Combining Eqs. (1) and (2) and consolidating units, the volume is given in terms of the measured quantities of flow and the rate of pressure increase:

$$\frac{dP}{dt}(T/S) = \frac{13.74 \text{ cm}^3}{V} f(sccm) \ (T = 23° \text{ C.}) \quad (3)$$

where the flow f is measured in the commonly used units of sccm (standard cubic centimeters per minute) and the rate of pressure change dP/dt is expressed in units of Torr/s (T/s).

The volume measured in this manner represents the available volume of the bubbler 110 (i.e., that which is not displaced with precursor liquid/solid), combined with the internal volume of the gas lines between the flow controller 310 and the valve which is closed to cause the pressurization. When performed for a newly installed bubbler 110, this measurement yields a value corresponding to a reference volume, against which all future measurements will be compared. As the precursor contained within the bubbler 110 is consumed, the remaining quantity displaces less volume than the original quantity, thereby increasing the available gas volume in the bubbler 110. Therefore, for a given flow rate into the bubbler, the pressurization rate decreases relative to the time zero value, according to Equation (3). Accordingly, this additional volume produces a measurable decrease in the pressurization rate, which can be translated into a volume, and mass, of precursor consumed.

The process for performing this measurement at a time instant may be carried out in a number of steps as described below.

After a new bubbler 110 is attached to the system its unfilled volume is characterized. First, it is opened to flow, and it is stabilized at low pressure, for example 100 Torr, with some known flow passing through it. All inlet and outlet valves should be open. Likewise, the bypass valve should also be left open, to minimize the transport of MO vapor during the measurement. If a push-flow controller is included, its flow should be set to zero.

The bubbler 110 is forced to pressurize by closing a downstream valve. Most conveniently this is simply the needle valve within the pressure controller 320. This pressure controller valve closure may be accomplished by giving the pressure controller 320 a very high set-point pressure, for example 1000 Torr.

As the bubbler 110 is pressurizing, the pressure is indicated continuously by the pressure controller 320. The pressurization rate is determined by measuring the time required to pressurize a given amount; for example, measuring the time required to pressurize from 300 to 700 Torr.

After recording the pressurization rate for one flow value, the measurement is repeated for several other flow values. The pressurization rate values are plotted as a function of flow and fit to Equation (3). The slope of this straight line is inversely proportional to the volume being filled, i.e., that which is not displaced by solid/liquid chemical.

Figure 4:
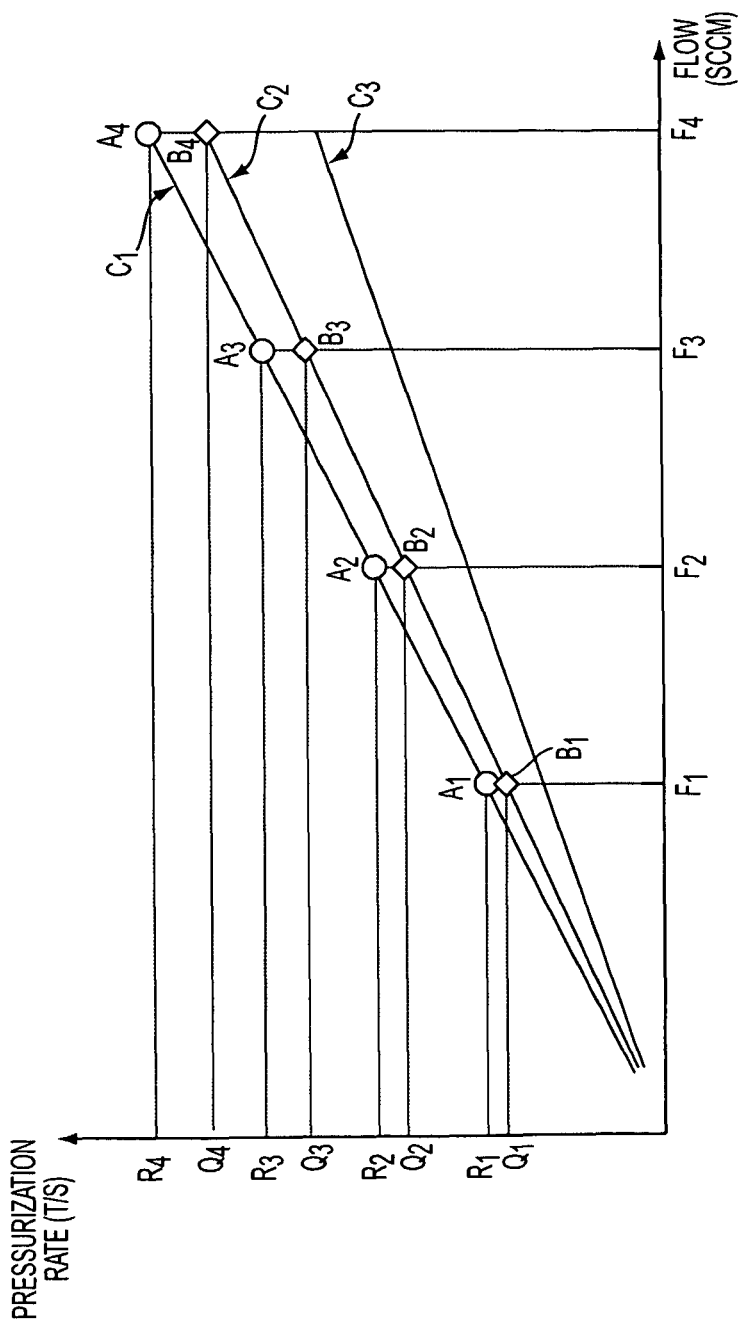
FIG. 4 is a diagram illustrating pressurization rate curves according to one embodiment.

FIG. 4 is a diagram illustrating pressurization rate curves according to one embodiment. The coordinates include the pressurization rate in T/sec and the flow in sccm. There are three lines $C_1$, $C_2$, and $C_3$.

The lines $C_1$ and $C_2$ are obtained as the lines fitting, using least squares curve fitting, the data points obtained during the control and measurement of the flow and pressure values in the bubbler 110 as discussed above. The lines $C_1$ and $C_2$ correspond to the measurements obtained at the first time instant and the second time instant, respectively. The data points $A_4$, $A_3$, $A_2$, and $A_1$ represent the pressurization rates $R_4$, $R_3$, $R_2$, and $R_1$ at the flows $F_4$, $F_3$, $F_2$, and $F_1$, respectively. The data points $B_4$, $B_3$, $B_1$ represent the pressurization rates $Q_4$, $Q_3$, $Q_2$, and $Q_1$ at the flows $F_4$, $F_3$, $F_2$, and $F_1$, respectively. It is noted that the flow values used in the second time instant may or may not be the same as those used in the first time instant. The objective is to select proper values to perform curve fitting efficiently and accurately. Lines $C_1$ and $C_2$ are the best fit lines of these data points using the flow offset $f_0$ and volume V as the fitting parameters according to the following equation:

$$\frac{dP}{dt}(T/S) = \frac{13.74 \text{ cm}^3}{V}(f - f_0)(sccm) \ (T = 23° \text{ C.}) \quad (4)$$

The volumes for the bubbler are obtained as the inverse of the slopes of the lines. When the first time instant is the initial time when the bubbler 110 is new, the volume obtained for the line $C_1$ corresponds to the unoccupied volume of the bubbler, plus the gas lines between the flow controller and the closed valve. In addition, the vendor of the precursor typically provides the mass of precursor liquid or solid contained in the bubbler. This indicates a known volume initially occupied by the precursor, assuming that the chemical's density is known. From this information, the expected pressurization rate behavior when all the material is consumed may be projected. The line $C_3$ shows the projected characteristic of the empty bubbler.

The line $C_2$ shows the pressurization rates at the second time instant. Line $C_2$ shows the decrease of pressurization rates compared to the initial values given by line $C_1$, indicating an increase in the volume due to the consumption of the material.

Figure 5:
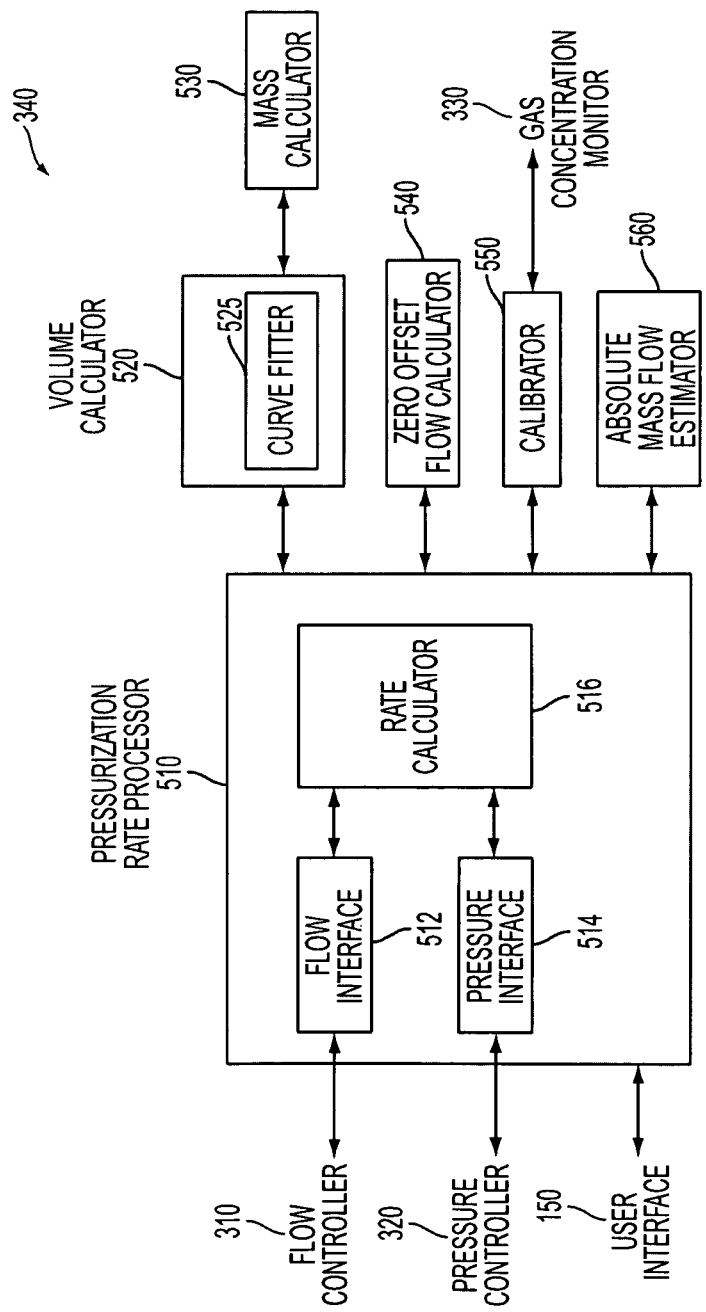
FIG. 5 is a diagram illustrating a control processor according to one embodiment.
Figure 8:
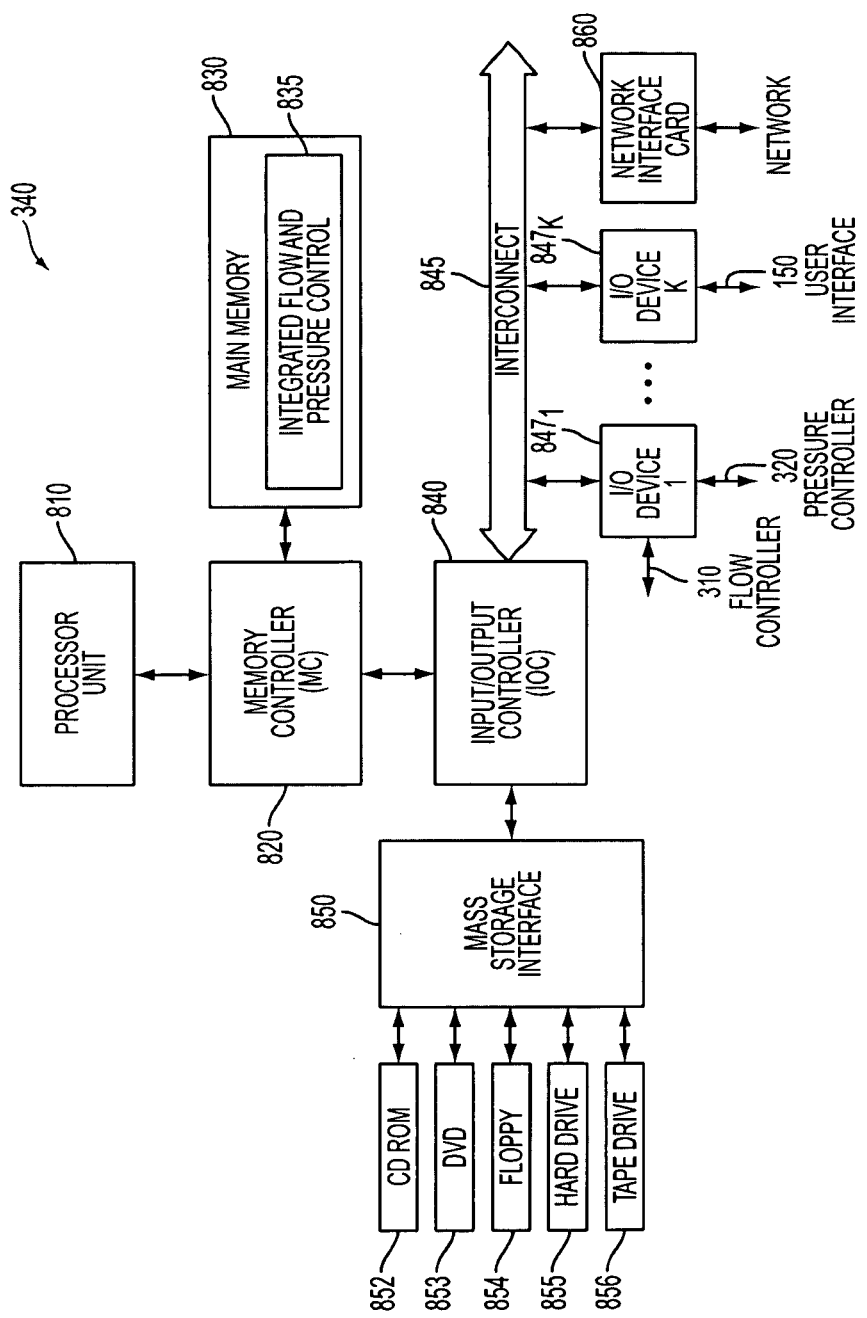
FIG. 8 is a diagram illustrating a control processor as a programmable system according to one embodiment.

FIG. 5 is a diagram illustrating the control processor 340 shown in FIG. 3 according to one embodiment. The control processor 340 includes a pressurization rate processor 510, a volume calculator 520, a mass calculator 530, a zero-offset flow calculator 540, a calibrator 550, and an absolute mass flow estimator 560. The control processor 340 may include more or less than the above components. In addition, any one of the above components may be implemented by hardware, software, firmware or any combination of hardware, software, and firmware. The control processor 340 may be implemented by a programmable processor such as a microprocessor, a micro-controller, a digital signal processor having associated memories to store instructions and data, as illustrated in FIG. 8.

The pressurization rate processor 510 calculates the pressurization rates in the bubbler 110 for first and second pressurization rate curves at the first and second time instants. For example, the first curve includes the pressurization rates $R_4$, $R_3$, $R_2$, and $R_1$ at the first time instant as shown in FIG. 4. The second curve includes the pressurization rates $Q_4$, $Q_3$, $Q_2$, and $Q_1$ at the second time instant as shown in FIG. 4.

The pressurization rate processor 510 includes a flow interface 512, a pressure interface 514, and a rate calculator 516. The flow interface 512 is coupled to the flow controller 310 to provide flow set points and obtain flow measurements for predetermined flow values in the plurality of flow measurements. In one embodiment, the predetermined flow values may be 5, 10, 15, and 20 sccm. The pressure interface 514 is coupled to the pressure controller 320 to provide pressure set points and obtain pressure and time measurements at the predetermined flow values. The rate calculator 516 is coupled to the flow and pressure interfaces 512 and 514 to calculate first and second pressurization rates at the predetermined flow values at the first and second time instants using the pressure and time measurements. The pressurization rate is determined by measuring the time required to pressurize from a starting pressure value to an ending pressure value. In one embodiment, the starting and ending pressure values are 300 Torrr and 700 Torr, respectively. The first and second pressurization rates form the first and second pressurization rate curves, respectively.

The volume calculator 520 computes the consumed volume based on first and second volumes at the respective first and second time instants. The first and second volumes are computed using slopes of lines fitting the first and second pressurization rate curves as discussed above. The volume calculator 520 may include a curve fitter 525 to curve fit the data points on the first and second pressurization rate curves to provide the lines similar to the lines $C_1$ and $C_2$ in FIG. 4.

The mass calculator 530 is coupled to the volume calculator 520 to compute the amount of precursor chemical in the bubbler 110 using the consumed volume and a known amount at the first time instant and density of the precursor chemical.

The zero-offset flow calculator 540 calculates a zero-offset flow using the lines as provided by the curve fitter 525 in the volume calculator 520. The calibrator 550 is coupled to the gas concentration monitor 330 to calibrate the gas concentration monitor 330 to improve its accuracy. The absolute mass flow estimator 560 estimates absolute mass flow of the precursor chemical.

Figure 6:
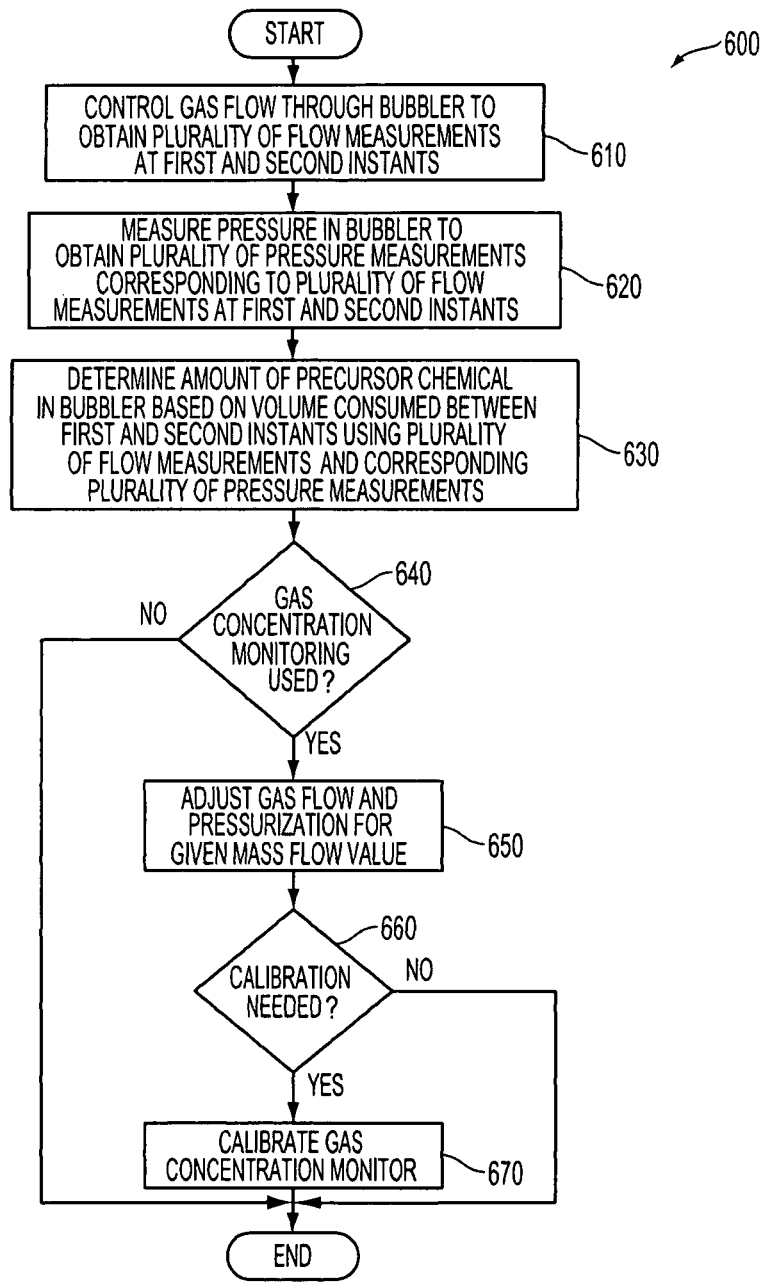
FIG. 6 is a flowchart illustrating a process to perform integrated flow and pressure control according to one embodiment.

FIG. 6 is a flowchart illustrating a process 600 to perform integrated flow and pressure control according to one embodiment.

Upon START, the process 600 controls a gas through a bubbler to obtain a plurality of flow measurements at first and second instants (Block 610). Next, the process 600 measures pressure in the bubbler to obtain a plurality of pressure measurements corresponding to the plurality of flow measurements at the first and second instants (Block 620). Then, the process 600 determines an amount of precursor chemical in the bubbler based on volume consumed between first and second instants using the plurality of flow measurements and the corresponding plurality of pressure measurements (Block 630).

Next, the process 600 determines if gas concentration monitoring is used (Block 640). If not, the process 600 is terminated. Otherwise, the process 600 adjusts gas flow and pressurization for a given mass flow value (Block 650). Typically, when a gas concentration monitor is used, then it is not necessary to use both the flow controller and the pressure controller. Then, the process 600 determines if calibration is needed (Block 660). If not, the process 600 is terminated. Otherwise, the process 600 calibrates the gas concentration monitor (Block 670) and is then terminated. The calibration may be carried out using known values of flows and pressures.

Figure 7:
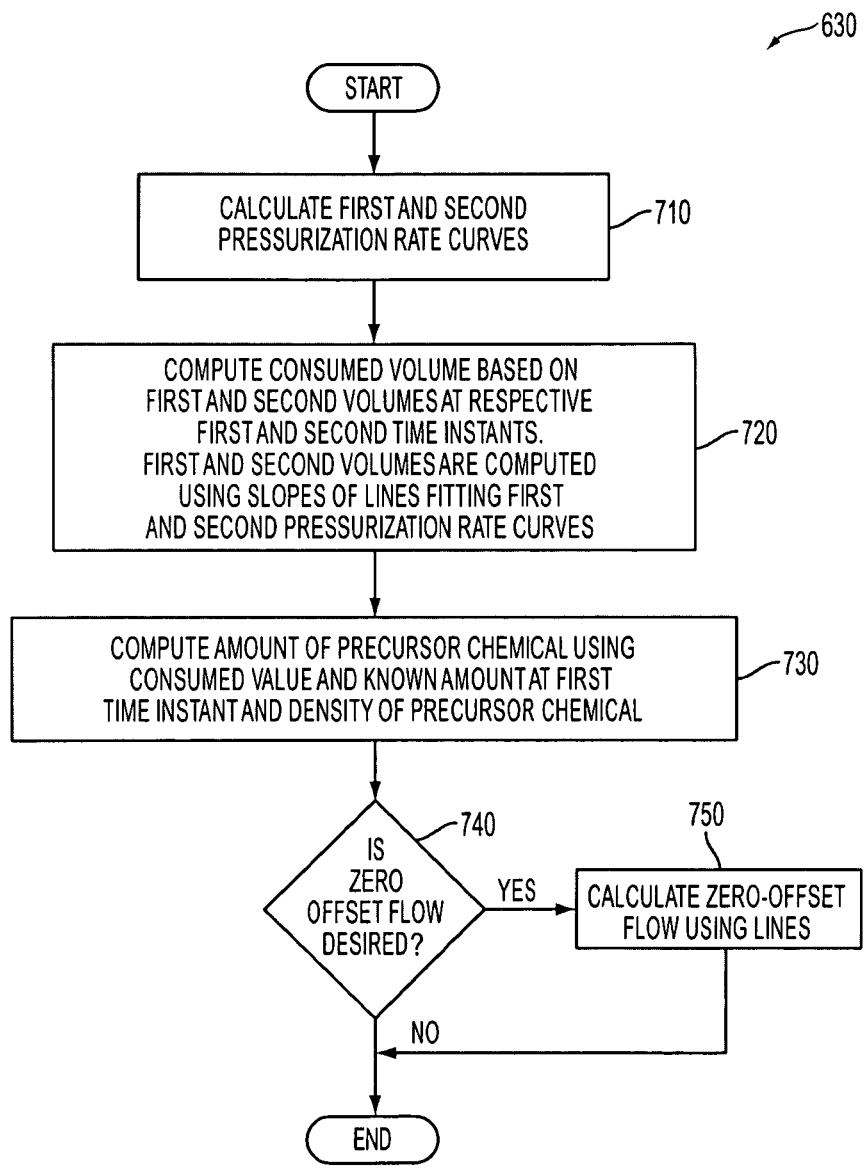
FIG. 7 is a flowchart illustrating a process to determine amount of precursor chemical according to one embodiment.

FIG. 7 is a flowchart illustrating a process 630 to determine amount of precursor chemical according to one embodiment.

Upon START, the process 630 calculates the first and second pressurization rate curves at the first and second time instants (Block 710). Next, the process 630 computes the consumed volume based on first and second volumes at the respective first and second time instants (Block 720). The first and second volumes are computed using slopes of lines fitting the first and second pressurization rate curves. The volume may be computed using the equation (3).

Then, the process 630 computes the amount of precursor chemical in the bubbler using the consumed volume and a known amount at the first time instant and density of the precursor chemical (Block 730). Next, the process 630 determines if zero-offset flow is desired (Block 740). If not, the process 630 is terminated. Otherwise, the process 630 calculates the zero-offset flow using the lines as fitted from the pressurization rate curves (Block 750) and is then terminated.

FIG. 8 is a diagram illustrating the control processor 340 as a programmable system according to one embodiment. The control processor 340 includes a processor unit 810, a memory controller (MC) 820, a main memory 830, an input/output controller (IOC) 840, an interconnect 845, a mass storage interface 850, input/output (I/O) devices $847_1$ to $847_K$, and a network interface card (NIC) 860. The control processor 340 may include more or less of the above components.

The processor unit 810 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture.

The MC 820 provides control and configuration of memory and input/output devices such as the main memory 830 and the IOC 840. The MC 820 may be integrated into a chipset that integrates multiple functionalities such as graphics, media, host-to-peripheral bus interface, memory control, power management, etc.

The main memory 830 stores system code and data. The main memory 830 is typically implemented with dynamic random access memory (DRAM), static random access memory (SRAM), or any other types of memories including those that do not need to be refreshed. The main memory 830 may include multiple channels of memory devices such as DRAMs. In one embodiment, the memory 830 may include an integrated flow and pressure control module 835 and the associated modules or functions. The integrated flow and pressure control module 835 may include functions, modules, programs, procedures, or methods that perform the functions described below. These functions may include, but are not limited to the pressurization rate processor 510, the volume calculator 520, the mass calculator 530, the zero-offset flow calculator 540, the calibrator 550, and the absolute mass flow estimator 560.

The IOC 840 has a number of functionalities that are designed to support I/O functions. The IOC 840 may also be integrated into a chipset together or separate from the MC 820 to perform I/O functions. The IOC 840 may include a number of interface and I/O functions such as peripheral component interconnect (PCI) bus interface, processor interface, interrupt controller, direct memory access (DMA) controller, power management logic, timer, system management bus (SMBus), universal serial bus (USB) interface, mass storage interface, low pin count (LPC) interface, wireless interconnect, direct media interface (DMI), etc.

The interconnect 845 provides interface to peripheral devices. The interconnect 845 may be point-to-point or connected to multiple devices. For clarity, not all interconnects are shown. It is contemplated that the interconnect 845 may include any interconnect or bus such as Peripheral Component Interconnect (PCI), PCI Express, Universal Serial Bus (USB), Small Computer System Interface (SCSI), serial SCSI, and Direct Media Interface (DMI), etc.

The mass storage interface 850 interfaces to mass storage devices to store archive information such as code, programs, files, data, and applications. The mass storage interface may include SCSI, serial SCSI, Advanced Technology Attachment (ATA) (parallel and/or serial), Integrated Drive Electronics (IDE), enhanced IDE, ATA Packet Interface (ATAPI), etc. The mass storage device may include compact disk (CD) read-only memory (ROM) 852, digital video/versatile disc (DVD) 853, floppy drive 854, hard drive 855, tape drive 856, and any other magnetic or optic storage devices. The mass storage device provides a mechanism to read machine-accessible media.

The I/O devices $847_1$ to $847_K$ may include any I/O devices to perform I/O functions. Examples of I/O devices $847_1$ to $847_K$ include controller for input devices (e.g., keyboard, mouse, trackball, pointing device), media card (e.g., audio, video, graphic), and any other peripheral controllers. The I/O devices $847_1$ to $847_K$ may interface to the flow controller 310, the pressure controller 320, and the user interface 150.

The NIC 860 provides network connectivity to the control processor 340. In one embodiment, the NIC 860 is compatible with both 32-bit and 64-bit peripheral component interconnect (PCI) bus standards. It is typically compliant with PCI local bus revision 2.2, PCI-X local bus revision 1.0, or PCI-Express standards. There may be more than one NIC 860 in the processing system. The NIC 860 may also support full-duplex Gigabit Ethernet interface, frame-based flow control, and other standards defining the physical layer and data link layer of wired Ethernet.

Elements of one embodiment may be implemented by hardware, firmware, software or any combination thereof. The term hardware generally refers to an element having a physical structure such as electronic, electromagnetic, optical, electro-optical, mechanical, electromechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment may be the code segments to perform the necessary tasks. The software/firmware may include the actual code to carry out the operations described in one embodiment, or code that emulates or simulates the operations. The program or code segments may be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that may store, transmit, receive, or transfer information. Examples of the processor readable or machine accessible medium that may store include a storage medium, an electronic circuit, a semiconductor memory device, a read only memory (ROM), a flash memory, an erasable programmable ROM (EPROM), a floppy diskette, a compact disk (CD) ROM, an optical disk, a hard disk, etc. Examples of the processor readable or machine accessible medium that may transmit, receive, or transfer information include a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus comprising:
    a flow controller to control gas flow through a bubbler, the flow controller providing a plurality of flow measurements at first and second instants;
    a pressure controller to measure pressure in the bubbler, the pressure controller providing a plurality of pressure measurements corresponding to the plurality of flow measurements at the first and second instants; and
    a control processor coupled to the flow controller and the pressure controller to determine amount of precursor chemical in the bubbler based on volume consumed between first and second instants using the plurality of flow measurements and the corresponding plurality of pressure measurements, wherein the control processor comprises:
        a pressurization rate processor to calculate first and second pressurization rate curves at the first and second time instants, wherein the pressurization rate processor comprises:
            a flow interface coupled to the flow controller to provide flow set points and obtain flow measurements for predetermined flow values in the plurality of flow measurements,
            a pressure interface coupled to the pressure controller to provide pressure set points and obtain pressure and time measurements at the predetermined flow values, and
            a rate calculator coupled to the flow interfaces to calculate first and second pressurization rates at the predetermined flow values at the first and second time instants using the pressure and time measurements, the first and second pressurization rates forming the first and second pressurization rate curves, respectively, and
        a volume calculator coupled to the pressurization rate processor to compute the consumed volume based on first and second volumes at the respective first and second time instants, the first and second volumes being computed using slopes of lines fitting the first and second pressurization rate curves.

2. The apparatus of claim 1 wherein the control processor further comprises:
    a zero-offset flow calculator to calculate zero-offset flow using the lines.

3. The apparatus of claim 1 further comprising:
    a gas concentration monitor coupled to at least one of the flow controller and the pressure controller to adjust the gas flow and pressurization in the bubbler for a given mass flow value.

4. The apparatus of claim 3 further comprising:
    a calibrator coupled to the gas concentration monitor to calibrate the gas concentration monitor to improve accuracy of the gas concentration monitor.

5. The apparatus of claim 1 wherein the control processor further comprises:
    an absolute mass flow estimator to estimate absolute mass flow of the precursor chemical.

6. The apparatus of claim 1 wherein the control processor further comprises:
    a mass calculator coupled to the volume calculator to compute the amount of precursor chemical in the bubbler using the consumed volume and a known amount at the first time instant and density of the precursor chemical.

7. The apparatus of claim 1 wherein the precursor chemical is used in a chemical vapor deposition.

8. An apparatus comprising:
    a flow controller to control gas flow through a bubbler, the flow controller providing a plurality of flow measurements at first and second instants;
    a pressure controller to measure pressure in the bubbler, the pressure controller providing a plurality of pressure measurements corresponding to the plurality of flow measurements at the first and second instants; and a control processor coupled to the flow controller and the pressure controller to determine amount of precursor chemical in the bubbler based on volume consumed between first and second instants using the plurality of flow measurements and the corresponding plurality of pressure measurements; the control processor comprising:
- a pressurization rate processor to calculate first and second pressurization rate curves at the first and second time instants, and
- a volume calculator coupled to the pressurization rate processor to compute the consumed volume based on first and second volumes at the respective first and second time instants, the first and second volumes being computed using slopes of lines fitting the first and second pressurization rate curves;

wherein volume calculator computes at least one of the first and second volumes as proportionally to an inverse of the slope of one of the lines fitting the first and second pressurization rate curves.

9. A method comprising:
controlling gas flow through a bubbler to obtain a plurality of flow measurements at first and second instants;
measuring pressure in the bubbler to obtain a plurality of pressure measurements corresponding to the plurality of flow measurements at the first and second instants; and
determining amount of precursor chemical in the bubbler based on volume consumed between first and second instants using the plurality of flow measurements and the corresponding plurality of pressure measurements, wherein determining amount of precursor chemical comprises:
- calculating first and second pressurization rate curves at the first and second time instants, wherein calculating first and second pressurization rate curves comprises:
  - providing flow set points and obtaining flow measurements for predetermined flow values in the plurality of flow measurements,
  - providing pressure set points and obtaining pressure and time measurements at the predetermined flow values, and
  - calculating first and second pressurization rates at the predetermined flow values at the first and second time instants using the pressure and time measurements, the first and second pressurization rates forming the first and second pressurization rate curves, respectively, and
- computing the consumed volume based on first and second volumes at the respective first and second time instants, the first and second volumes being computed using slopes of lines fitting the first and second pressurization rate curves.

10. The method of claim 9 wherein determining amount of precursor chemical further comprises:
calculating zero-offset flow using the lines.

11. The method of claim 9 further comprising:
adjusting the gas flow and pressurization in the bubbler for a given mass flow value using a gas concentration monitor.

12. The method of claim 11 further comprising:
calibrating the gas concentration monitor to improve accuracy of the gas concentration monitor.

13. The method of claim 9 wherein determining amount of precursor chemical further comprises:
estimating absolute mass flow of the precursor chemical.

14. The method of claim 9 wherein determining amount of precursor chemical further comprises:
computing the amount of precursor chemical in the bubbler using the consumed volume and a known amount at the first time instant and density of the precursor chemical.

15. The method of claim 9 wherein the precursor chemical is used in a chemical vapor deposition.

16. A method comprising:
controlling gas flow through a bubbler to obtain a plurality of flow measurements at first and second instants;
measuring pressure in the bubbler to obtain a plurality of pressure measurements corresponding to the plurality of flow measurements at the first and second instants; and
determining amount of precursor chemical in the bubbler based on volume consumed between first and second instants using the plurality of flow measurements and the corresponding plurality of pressure measurements, determining amount of precursor chemical comprising:
- calculating first and second pressurization rate curves at the first and second time instants, and
- computing the consumed volume based on first and second volumes at the respective first and second time instants, the first and second volumes being computed using slopes of lines fitting the first and second pressurization rate curves;

wherein computing the consumed volume comprises computing at least one of the first and second volumes as proportionally to an inverse of the slope of one of the lines fitting the first and second pressurization rate curves.

17. An article of manufacture comprising:
a non-transitory machine-accessible storage medium including data that, when accessed by a machine, causes the machine to perform operations comprising:
controlling gas flow through a bubbler to obtain a plurality of flow measurements at first and second instants;
measuring pressure in the bubbler to obtain a plurality of pressure measurements corresponding to the plurality of flow measurements at the first and second instants; and
determining amount of precursor chemical in the bubbler based on volume consumed between first and second instants using the plurality of flow measurements and the corresponding plurality of pressure measurements, wherein determining amount of precursor chemical comprises:
- calculating first and second pressurization rate curves at the first and second time instants, wherein calculating first and second pressurization rate curves comprises:
  - providing flow set points and obtaining flow measurements for predetermined flow values in the plurality of flow measurements,
  - providing pressure set points and obtaining pressure and time measurements at the predetermined flow values, and
  - calculating first and second pressurization rates at the predetermined flow values at the first and second time instants using the pressure and time measurements, the first and second pressurization rates forming the first and second pressurization rate curves, respectively, and
- computing the consumed volume based on first and second volumes at the respective first and second time instants, the first and second volumes being computed using slopes of lines fitting the first and second pressurization rate curves.

18. A system comprising:
a bubbler containing metal organic sources used in chemical vapor deposition;

a valve and sensing unit coupled to the bubbler having a flow valve and sensing unit and a pressure valve and sensing unit; and an integrated flow and pressure controller coupled to the valve and sensing unit, the integrated flow and pressure controller comprising:

a flow controller to control gas flow through the bubbler using the flow valve and sensing unit, the flow controller providing a plurality of flow measurements at first and second instants, a pressure controller to measure pressure in the bubbler using the presser valve and sensing unit, the pressure controller providing a plurality of pressure measurements corresponding to the plurality of flow measurements at the first and second instants, and a control processor coupled to the flow controller and the pressure controller to determine amount of precursor chemical in the bubbler based on volume consumed between first and second instants using the plurality of flow measurements and the corresponding plurality of pressure measurements, wherein the control processor comprises:

a pressurization rate processor to calculate first and second pressurization rate curves at the first and second time instants, wherein the pressurization rate processor comprises:

a flow interface coupled to the flow controller to provide flow set points and obtain flow measurements for predetermined flow values in the plurality of flow measurements, a pressure interface coupled to the pressure controller to provide pressure set points and obtain pressure and time measurements at the predetermined flow values, and a rate calculator coupled to the flow interfaces to calculate first and second pressurization rates at the predetermined flow values at the first and second time instants using the pressure and time measurements, the first and second pressurization rates forming the first and second pressurization rate curves, respectively, and a volume calculator coupled to the pressurization rate processor to compute the consumed volume based on first and second volumes at the respective first and second time instants, the first and second volumes being computed using slopes of lines fitting the first and second pressurization rate curves.

19. An apparatus comprising:

a pressurization rate processor to calculate first and second pressurization rate curves at first and second time instants, wherein the pressurization rate processor comprises:

a flow interface coupled to a flow controller to provide flow set points and obtain flow measurements for predetermined flow values in a plurality of flow measurements, a pressure interface coupled to a pressure controller to provide pressure set points and obtain pressure and time measurements at the predetermined flow values, and a rate calculator coupled to the flow interfaces to calculate first and second pressurization rates at the predetermined flow values at the first and second time instants using the pressure and time measurements, the first and second pressurization rates forming the first and second pressurization rate curves, respectively; and a volume calculator coupled to the pressurization rate processor to compute consumed volume based on first and second volumes at the respective first and second time instants, the first and second volumes being computed using slopes of lines fitting the first and second pressurization rate curves.

* * * * *